US009258032B2

United States Patent
Barrenscheen et al.

(10) Patent No.: US 9,258,032 B2
(45) Date of Patent: *Feb. 9, 2016

(54) SYSTEM AND METHOD FOR RECEIVING DATA ACROSS AN ISOLATION BARRIER

(71) Applicant: Infineon Technologies Austria AG, Villach (AT)

(72) Inventors: Jens Barrenscheen, Munich (DE); Dirk Hammerschmidt, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 14/177,882

(22) Filed: Feb. 11, 2014

(65) Prior Publication Data

US 2014/0162552 A1 Jun. 12, 2014

Related U.S. Application Data

(63) Continuation of application No. 12/696,995, filed on Jan. 29, 2010, now Pat. No. 8,660,489.

(51) Int. Cl.
*H04B 17/00* (2015.01)
*H04B 5/00* (2006.01)
*G08C 17/06* (2006.01)

(52) U.S. Cl.
CPC .............. *H04B 5/0031* (2013.01); *G08C 17/06* (2013.01)

(58) Field of Classification Search
CPC ...... H04B 5/02; H04B 17/0042; H04W 24/00
USPC .............................................. 455/41.1, 67.11
See application file for complete search history.

(56) References Cited

U.S. PATENT DOCUMENTS

| 4,320,508 A | 3/1982 | Takezoe |
| 6,161,762 A | 12/2000 | Bashan et al. |
| 6,204,770 B1 | 3/2001 | Johnson |
| 6,262,600 B1 * | 7/2001 | Haigh .................... H04L 25/493 326/21 |
| 6,525,566 B2 * | 2/2003 | Haigh .................... H04L 25/493 326/31 |
| 6,597,277 B2 * | 7/2003 | Hellriegel ............... H01C 7/003 338/262 |
| 6,615,023 B1 | 9/2003 | Ehrensvard |
| 6,751,315 B1 * | 6/2004 | Liu ........................ H04M 19/00 370/488 |
| 6,903,578 B2 * | 6/2005 | Haigh .................... H04L 25/493 326/21 |
| 6,922,080 B2 * | 7/2005 | Haigh .................... H04L 25/493 326/31 |
| 7,283,594 B1 | 10/2007 | Wood |
| 7,554,335 B2 | 6/2009 | Han et al. |
| 7,720,438 B2 * | 5/2010 | Rowse ................. H04B 5/0056 455/41.1 |
| 7,839,938 B2 * | 11/2010 | Hershbarger ........ G01R 33/025 375/258 |
| 8,339,139 B2 | 12/2012 | Barrenscheen et al. |
| 2003/0128053 A1 * | 7/2003 | Haigh .................... H04L 25/493 326/82 |
| 2004/0207431 A1 * | 10/2004 | Haigh .................... H04L 25/493 326/83 |
| 2004/0239487 A1 | 12/2004 | Hershbarger |
| 2006/0229113 A1 | 10/2006 | Rowse |
| 2007/0014373 A1 * | 1/2007 | Hershbarger ........ G01R 33/025 375/258 |
| 2007/0250285 A1 | 10/2007 | Thoman |
| 2008/0311862 A1 | 12/2008 | Spina et al. |

FOREIGN PATENT DOCUMENTS

| CN | 1199482 A | 11/1998 |
| CN | 1292184 A | 4/2001 |
| CN | 1404596 A | 3/2003 |
| CN | 1830199 A | 9/2006 |
| CN | 101147114 A | 3/2008 |
| DE | 4444984 | 12/1995 |
| WO | 9714112 | 4/1997 |
| WO | 2009089146 | 7/2009 |

\* cited by examiner

*Primary Examiner* — April G Gonzales
(74) *Attorney, Agent, or Firm* — Slater & Matsil, L.L.P.

(57) ABSTRACT

In one embodiment, a system for communication has a receiver for receiving data from a passive transmitter capacitively coupled to the receiver. The receiver has a sensing element having a plurality of terminals configured to be capacitively coupled to the passive transmitter and DC isolated from the passive transmitter.

21 Claims, 8 Drawing Sheets

SYSTEM AND METHOD FOR RECEIVING DATA ACROSS AN ISOLATION BARRIER

This is a continuation application of U.S. application Ser. No. 12/696,995, entitled "System and Method for Receiving Data Across an Isolation Barrier" which was filed on Jan. 29, 2010 and issued on Feb. 25, 2014 as U.S. Pat. No. 8,660,489, which application is incorporated herein by reference in its entirety.

TECHNICAL FIELD

This invention relates generally to electrical components, and more particularly to a system and method for receiving data across an isolation barrier.

BACKGROUND

In a number of electronic applications, for example, power supplies and safety systems, it is necessary to exchange data between circuits that are electrically isolated from each other. For example, in an air-bag deployment controller, two control domains work in parallel to deliver a validation signal to fire the air-bag. To minimize fault coupling between these control domains, each domain has independent clock sources and power supplies. Furthermore, portions of an airbag controller are isolated from other portions of a car's electronic system in order to ensure that the airbag can be deployed even in the event of a failure of the car's electronic system. In some systems, communication takes place across an isolation barrier such as an air gap, printed circuit board (PCB), or other isolating material that does not pass direct current (DC). In some systems, communication takes place between circuits that are not referenced to the same ground potential.

Conventional systems for data exchange over isolation barriers include, for example, optocouplers, capacitive couplers, and/or inductive couplers, which transmit energy across the isolation barrier. An LED of an optocoupler transmits optical power to drive an active data level, while inductive and capacitive couplers transmit repetitive current and/or voltage pulses to be detected by an isolated receiver. A transmitter for an inductive coupler, for example, generally sends data by passing current pulses though a coil and or a transformer. A capacitive coupler based on a charge pump principal, on the other hand, sends current pulses by transferring charge from at least one capacitive storage element at the transmitting side to an isolated receiving element at the receiving side. Because isolation barriers generally do not pass DC current, even the transmission of static data usually requires continual transmission energy in the form of refresh pulses in order to prevent data failures.

What is needed are reliable and power efficient systems and methods for transferring data across an isolation barrier.

SUMMARY OF THE INVENTION

In one embodiment, a system for communication has a receiver for receiving data from a passive transmitter capacitively coupled to the receiver. The receiver has a capacitive sensor having a plurality of terminals configured to be capacitively coupled to the passive transmitter and DC isolated from the passive transmitter.

The foregoing has outlined, rather broadly, features of the present invention. Additional features of the invention will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present invention and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to embodiments in a specific context, namely systems and methods for receiving data across an isolation barrier. Embodiments of this invention may also be applied to systems and methods directed toward other data communication.

In embodiments of the present invention, data is sent across an isolation barrier by a passive transmitter, such as a switch, coupled to a first side of the isolation barrier. A sensing element coupled to a second side of the isolation barrier receives the data sent by the passive transmitter by detecting a change in impedance seen at the second side of the isolation barrier. As the switch is opened and closed, the impedance seen by the sensing element changes. Data, therefore, can be sent across the isolation barrier with little or no transmitted power by modulating an impedance. Power consumption on the receiver side of embodiment systems depends on repetition rate of the impedance measurement. To further reduce power consumption, receiver activity can be controlled by only performing impedance measurements when information exchange is needed by the system in some embodiments. For example, in one embodiment, transmissions are synchronized to a trigger signal or a shift clock signal.

Figure 1A:
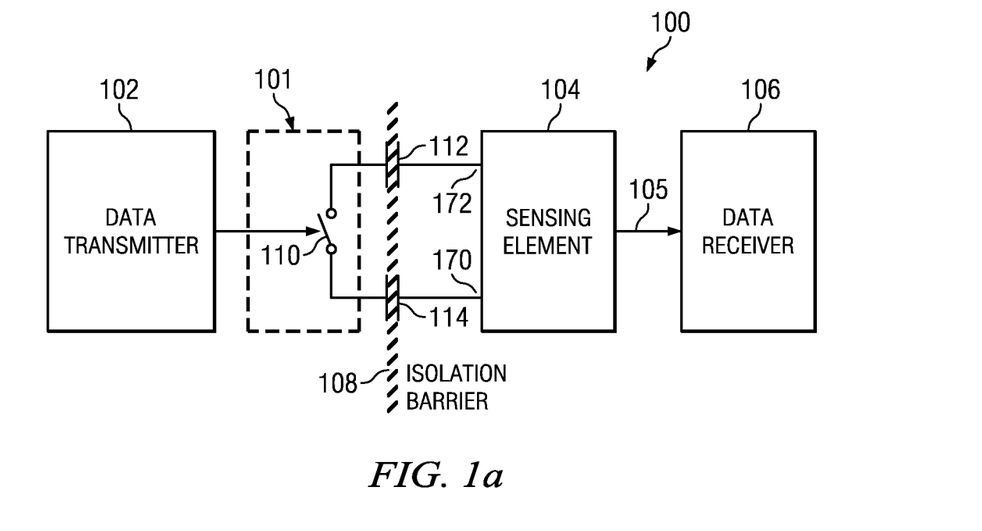
FIGS. 1a-1d illustrate an embodiment isolation barrier transmission system.

FIG. 1a illustrates embodiment data transmission system 100 that transmits data across isolation barrier 108. System 100 has data transmitter 102 coupled to passive data transmitter 101. In an embodiment of the present invention, passive data transmitter 101 is implemented by switch 110 coupled to isolation barrier 108 via electrodes (not shown). Switch 110 is implemented by a metal-oxide semiconductor transistor (MOSFET), however, other types of transistors or devices can be used. Alternatively, passive data transmitter 101 can be implemented by other circuits that effect a change in impedance. In some embodiments, a capacitance is modulated by the passive transmitter 101. In alternative embodiments, the modulated capacitance can be replaced by other elements that can be modulated, for example, a resistance. Sensing element 104 has two terminals 170 and 172 coupled to isolation barrier 108. The coupling capacitance between sensing element 104 and passive transmitter 101 is represented by capacitances 112 and 114.

In an embodiment, data transmitter closes switch 110 when transmitted data is in a first state, and opens switch 110 when the transmitted data is in a second state. For example, switch 110 is closed or in a low impedance state when a logical "1" is being transmitted and open or in a high impedance state when a logical "0" is being transmitted. Alternatively, switch 110 is closed or in a low impedance state when a logical "0" is being transmitter and open or in a high impedance state when a logical "1" is being transmitted. In alternative embodiments of the present invention, multi-level data can be transmitted by further modulating the impedance of passive transmitter 101 to include intermediate impedance states between the high impedance state and low impedance state. In embodiments data transmitter 102 can transmit data in an unencoded form, or in a coded form using a coding scheme, such as Manchester coding. Alternatively, other coding schemes such as non-return to zero (NRZ) can be used.

Sensing element 104 detects the impedance between terminals 170 and 172. It can be seen that when switch 110 is closed, the impedance between terminals 172 and 170 approximately corresponds to capacitances, 112 and 114 in parallel. When switch 110 is open, however, the impedance between 170 and 172 is dominated by other parasitic paths and is, therefore, different (higher in this example). During operation of system 100, sensing element 104 measures the impedance between terminals 170 and 172 and compares the measured impedance to a threshold. If the measured impedance is greater than the threshold, switch 110 is assumed to be closed and sensing element 104 outputs a first logical state on line 105. If, on the other hand, the measured impedance is not greater than the threshold, sensing element 104 outputs a second logical state on line 105.

Data receiver 106 includes logic for receiving data from sensing element 104. In an embodiment, data receiver 106 directly uses the information for further data treatment. In other embodiments, the received data is first decoded from the data stream delivered by the sensing element, according to the coding scheme (e.g., Manchester Coding) used by the transmitter.

Figure 1B:
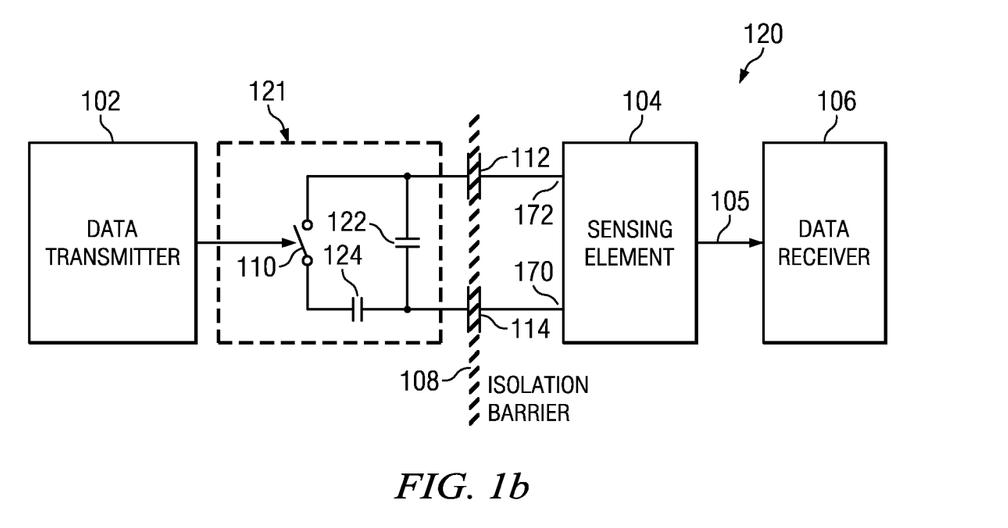

FIG. 1b illustrates embodiment data transmission system 120, in which extra capacitors 122 and 124 are coupled to switch 110 in passive transmitter 121. Extra capacitance from capacitors 122 and 124 is used to increase or adjust the change in impedance seen by sensing element 104. The sizes of the extra capacitors are chosen to provide detectable change in impedance seen by sensing element 104. The capacitance values of the extra capacitors 122 and 124 are adapted to the resolution of the sensing element 104 to compensate for drift and other parasitic effects. In embodiments where the potential between the transmitter and the receiver quickly changes (e.g., in power inverters or switched mode power supplies), current is induced into sensing element 104 due to the capacitive coupling. Extra capacitors 122 and 124 on the transmitter side and the filtering of the measured value on the receiver side are adapted to achieve a sufficient signal to noise ratio to achieve detectable values for data communication.

Figure 1C:
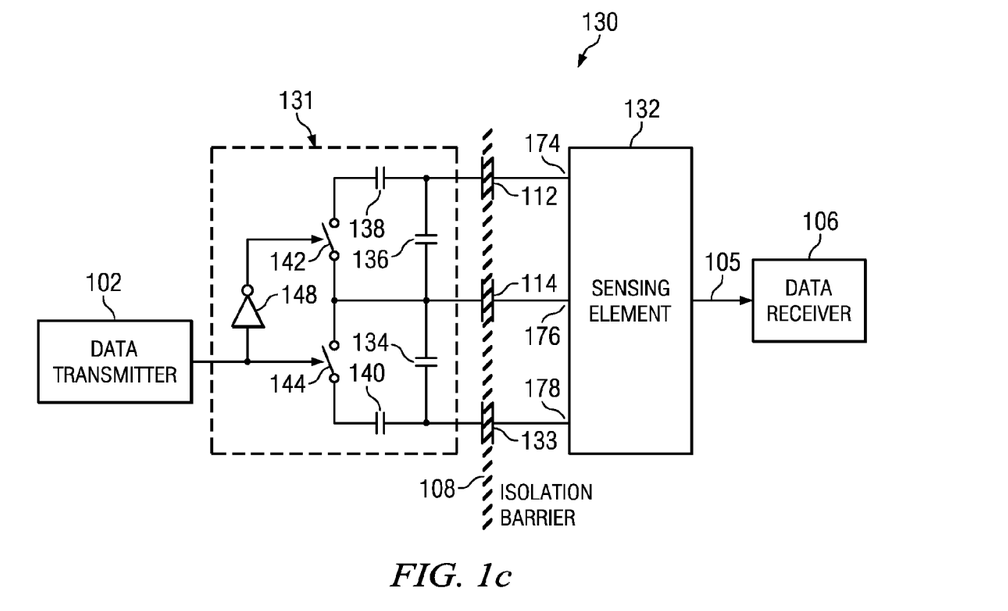

FIG. 1c illustrates embodiment data transmission system 130 using a differential transmission scheme. Data transmitter 102 is coupled to differential passive transmitter 131 having two switches 142 and 144 coupled to the output and input of inverter 148, respectively so that the switches 142 and 144 are in opposite states. For example, when switch 142 is open, switch 144 is closed, and when switch 142 is closed, switch 144 is open. In an embodiment, switches 142, 144 are coupled to isolation barrier 108 via capacitors 134, 136, 138 and 140. In alternative embodiments, however, some or all of these capacitors can be omitted depending on the application and its specifications. The capacitance of isolation barrier 108 between passive transmitter 131 and sensing element 132 is represented by capacitances 112, 114 and 133.

Sensing element 132, which is coupled to isolation barrier 108 via terminals 174, 176 and 178, measures a first impedance between terminals 174 and 176, and a second impedance between terminals 176 and 178. If the first impedance is greater than the second impedance, sensing element 132 determines that a first logical state has been transmitted by passive transmitter 131. If, on the other hand, the second impedance is greater than the first impedance, sensing element 132 determines that a second logic state has been transmitted by passive transmitter 131. In alternative embodiments, however, a bias is applied to the comparison between the first and second impedance to compensate for asymmetries in the coupling between the passive transmitter 131 and sensing element 132. Using differential transmission and sensing can achieve better noise immunity achieved in some embodiments.

Figure 1D:
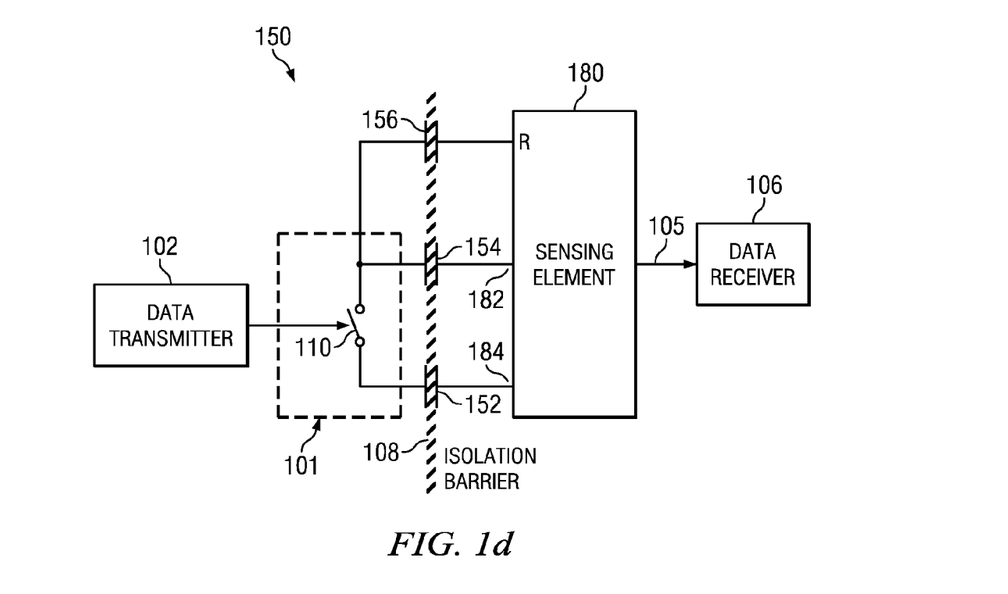

FIG. 1d illustrates embodiment transmission system 150 using sensing element 180 having three terminals 182, 184 and R. Capacitances 154, 152 and 156 represent the capacitance of isolation barrier 108 between switch 110 and terminals 182, 184 and R of sensing element 180, respectively. Sensing element 180 measures a first impedance between terminals 182 and 184, and a second impedance between terminals 182 and R. If a ratio of the first impedance to the second impedance is greater than a threshold, sensing element 180 determines that a first logic state has been transmitted by passive transmitter 101. If the ratio of the first impedance to the second impedance is not greater than the threshold, sensing element 180 determine that a second logic state has been transmitted by passive transmitter 101.

Alternatively, sensing element 180 determines that a first logic state has been transmitted by passive transmitter 101 if the first impedance is greater than the second impedance, and determines that a second logic state has been transmitted by passive transmitter 101 if the second impedance is greater than the first impedance. In a further embodiment, a bias can be applied to this comparison to adjust for asymmetries. Asymmetries can also be adjusted by coupling additional impedance to passive transmitter 101 or sensing element 180. Sensing elements 132 and 180 shown in FIGS. 1c and 1d can be similar, in some embodiments, such that only the modulation strategy of data transmitter 102 is different. In FIG. 1c, both impedances are modulated (if one impedance is increased, the other is decreased to achieve a differential effect). In FIG. 1d, only one impedance is modulated, and the other impedance (reference) is held constant. System 130 of FIG. 1c requires an additional switch, compared to FIG. 1d, however, system 130 of FIG. 1c can operate with smaller impedances in some embodiments. For example, smaller impedances can be implemented using smaller capacitances, which are easy to implement on an integrated circuit.

Figure 2A:
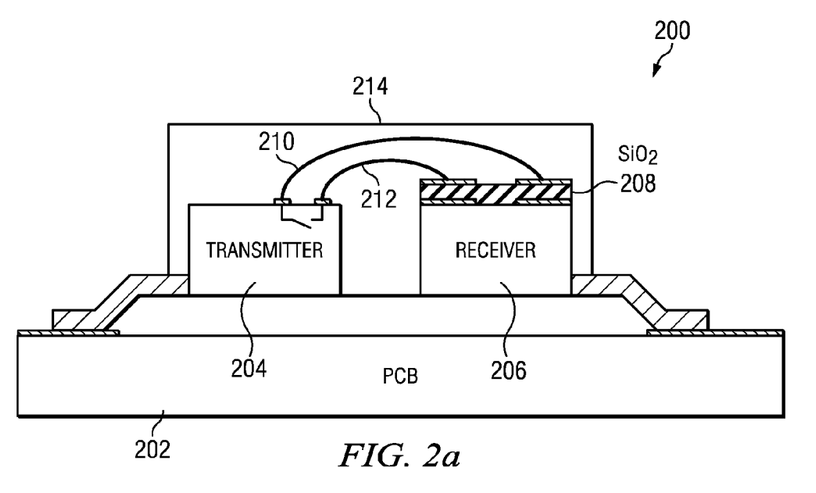
FIGS. 2a-2d illustrate embodiment implementations of isolation barrier transmission system.

FIG. 2a illustrates system 200, in which package 214 having two semiconductor dies 204 and 206 is mounted on PCB 202. Bondwires 210 and 212 couple a passive transmitter on die 204 to a receiver on die 206 via isolation barrier 208 disposed on die 206. Alternatively, isolation barrier 208 can be disposed on die 204. The passive transmitter on die 204 has a device, for example, a switch that modulates an impedance. The receiver on die 206 includes a capacitive sensor. The passive transmitter and receiver operate according to embodiments described herein. In an embodiment, isolation barrier 208 is a $SiO_2$ layer. Alternatively, isolation barrier 208 can be implemented by a nitride passivation layer, or other insulator.

Figure 2B:
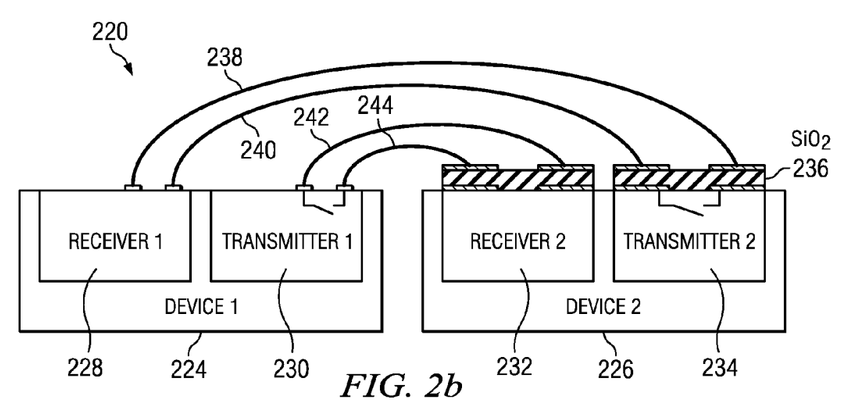

FIG. 2b illustrates bi-directional system 220, in which two dies, 224 and 226 each have a passive transmitter and a receiver. Passive transmitter 230 on die 224 is coupled to receiver 232 on die 226 via bondwires 242 and 244 and isolation barrier 236, and passive transmitter 234 on die 226 is coupled to receiver 228 on die 224 via bondwires 238 and 240 and isolation barrier 236. Isolation barrier 236 is disposed on die 226. The passive transmitter and receiver operate according to embodiments described herein.

Figure 2C:
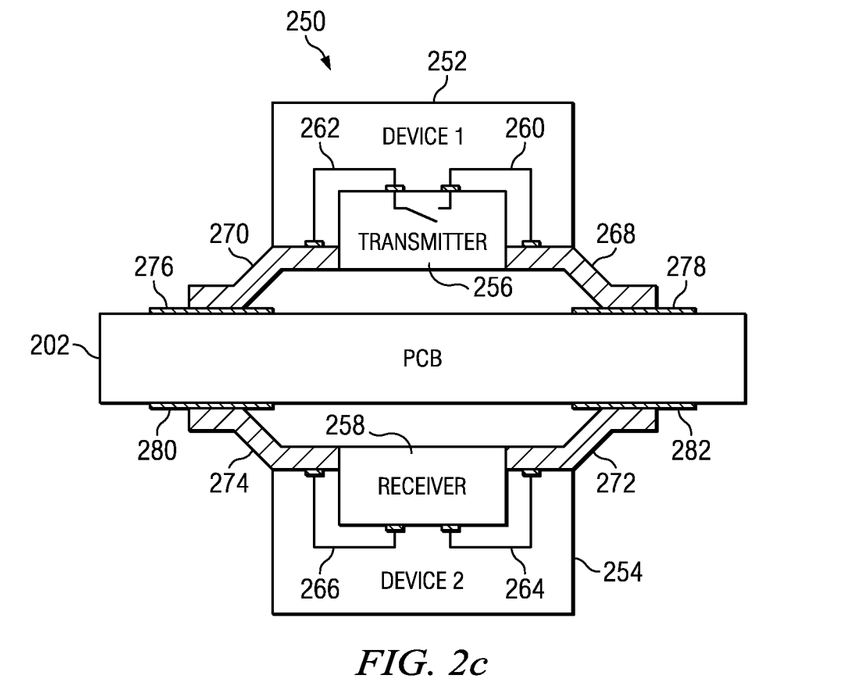

In FIG. 2c, system 250 is illustrated in which a passive transmitter in package 252 is coupled to a receiver in package 254 via an isolation barrier formed by PCB 202. In package 252, a passive transmitter is disposed on die 256, which is coupled to package pins 268 and 270 via bondwires 260 and 262, respectively. In package 254, a receiver is disposed on die 258, which is coupled to package pins 272 and 274 via bondwires 264 and 266, respectively. In alternative embodiments, other package types can be used, for example, packages in which the die is coupled to the package pins via bump bonded connections. The passive transmitter in package 252 is coupled to PCB 202 via electrodes 276 and 278, and the receiver in package 254 is coupled to PCB 202 via electrodes 280 and 282. In embodiments of the present invention, electrodes 276, 278, 280 and 282 are implemented by solder pads, however, in alternative embodiments, other structures can be used to provide coupling to PCB 202. Packages 252 and 254 are mounted on opposite sides of PCB 202 with sensing electrode pairs positioned across from each other. Alternatively, package 254 can be mounted on the same side of PCB 202 as package 252, with pins 272 and 274 coupled to bottom side electrodes 282 and 280 using standard vias. The coupling capacitors are given by geometrically overlapping conducting areas on the PCB, e.g., an electrode on each side of the PCB. Passive transmitter 296 and receiver 298 operate according to embodiments described herein.

Figure 2D:
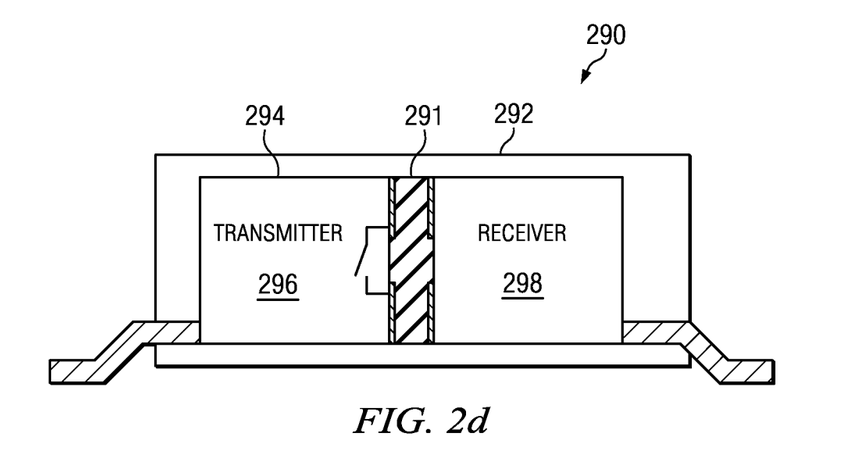

FIG. 2d illustrates system 290 in which package 292 has a single die 294. Passive transmitter 296 is coupled to receiver 298 via on-chip isolation barrier 291. In an embodiment, on-chip isolation barrier 291 is implemented using a trench filled with isolating material between the passive transmitter 296 and receiver 298. In alternative embodiments, the sensing electrodes are located on both sides of the trench. In other embodiments, insulating layer 291 can be implemented using other on-chip isolation structures such as silicon on insulator (SOI) or PN junctions. The passive transmitter and receiver operate according to embodiments described herein.

Figure 3A:
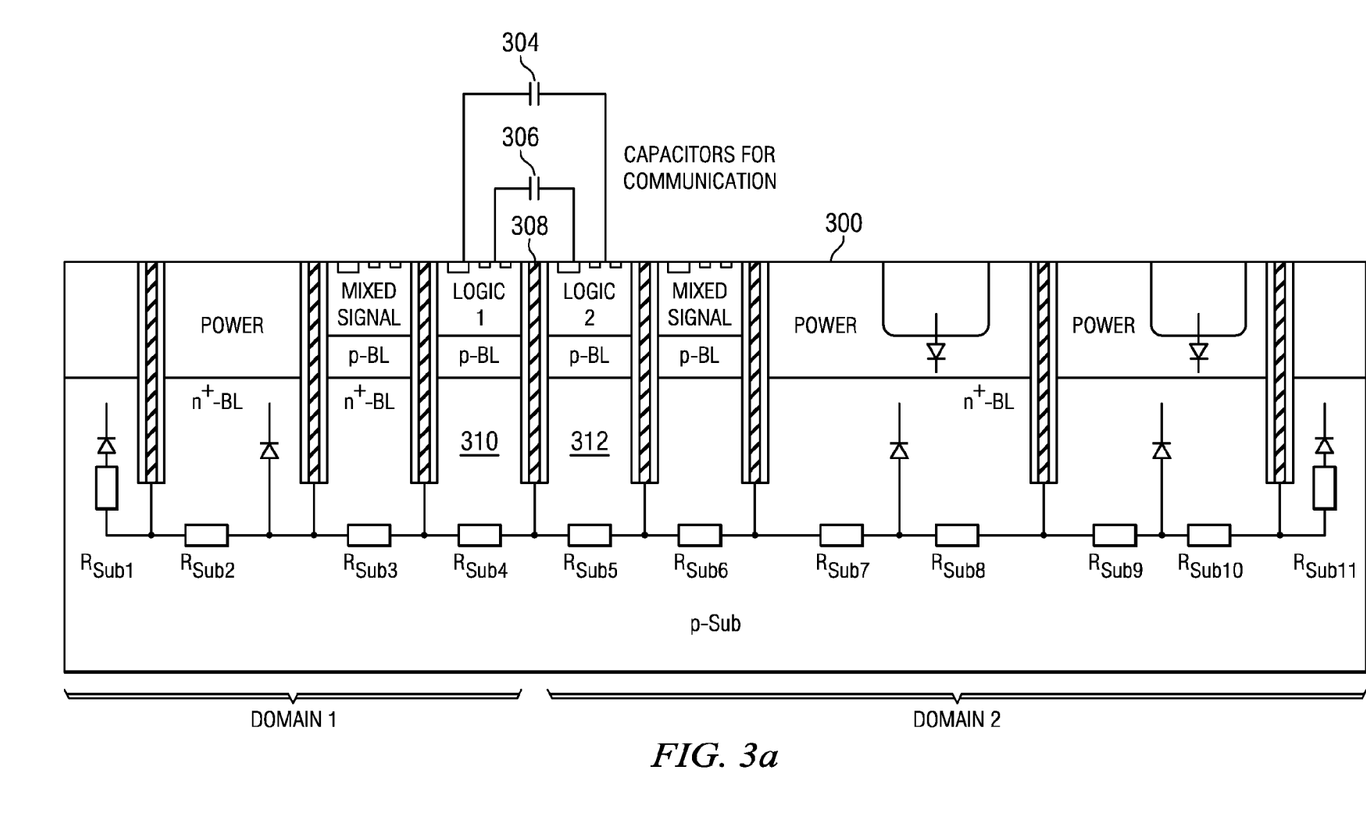
FIGS. 3a-3b illustrate an embodiment isolation barrier transmission system on an integrated circuit substrate.

FIG. 3a illustrates integrated circuit cross-section 300 that is divided into two isolated domains, Domain 1 and Domain 2. The two domains on the substrate are isolated by deep trench 308, to ensure that the circuit of Domain 2 maintains operability even if there is a worst case malfunction in Domain 1, for example, when the power supply of Domain 1 fails. In an embodiment, deep trench 308 is filled with $SiO_2$ to prevent current flow between Domain 1 and Domain 2. Such isolation is desirable in applications such as circuits that control airbag deployment in automobiles. A passive transmitter 310 in Domain 1 is coupled to receiver 312 in Domain 2 via internal or external capacitors 304 and 306. By using a passive transmitter 310 in the context of an embodiment communication scheme, any energy transferred across the borders of Domain 1 and Domain 2 is limited to a level that does not cause a consecutive fault in an opposite domain.

In an embodiment, the passive transmitter in Domain1 indicates when the power supply of Domain 1 allows operation of Domain 1. Here, a permanent indication of the state of Domain 1 to Domain 2 is possible, even if Domain 1 is in a power down mode.

Figure 3B:
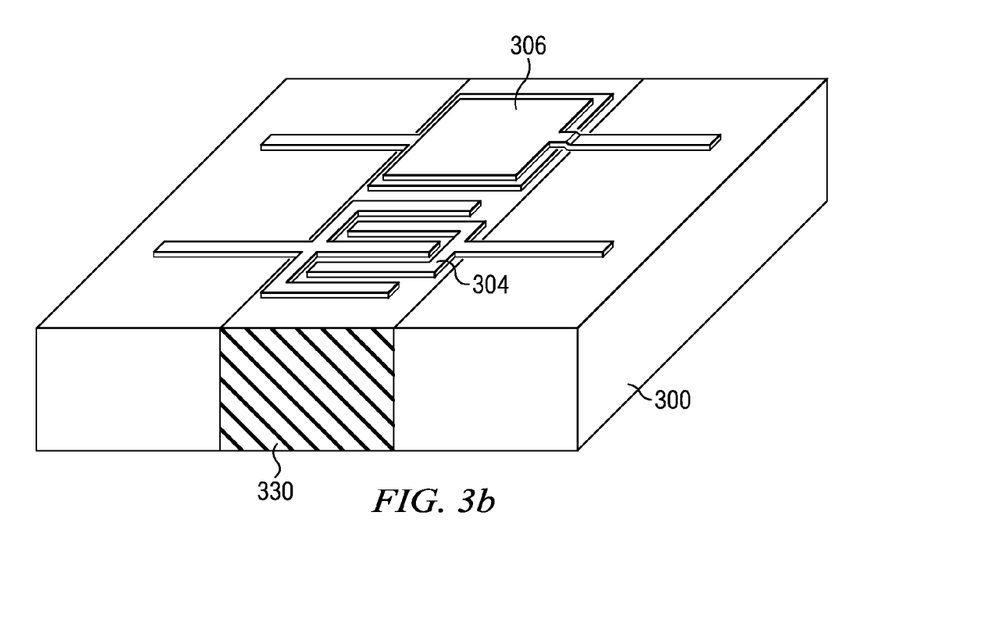

FIG. 3b illustrates an embodiment implementation of coupling capacitors 304 and 306 (see FIG. 3a). In an embodiment, coupling capacitors 304 and 306 are realized by metal structures from both sides of SiO2 safety barrier 330. Capacitor 304 is realized horizontally by metal lines in the same layer as an interdigitated structure. Alternatively, capacitor 306 is implemented vertically by overlapping areas of different layers. In further embodiments, additional layers can be used to increase the capacitance (e.g., to form a sandwich capacitor) or as shielding layers to avoid interference between adjacent channels, substrate coupling or RF emissions.

Figure 4:
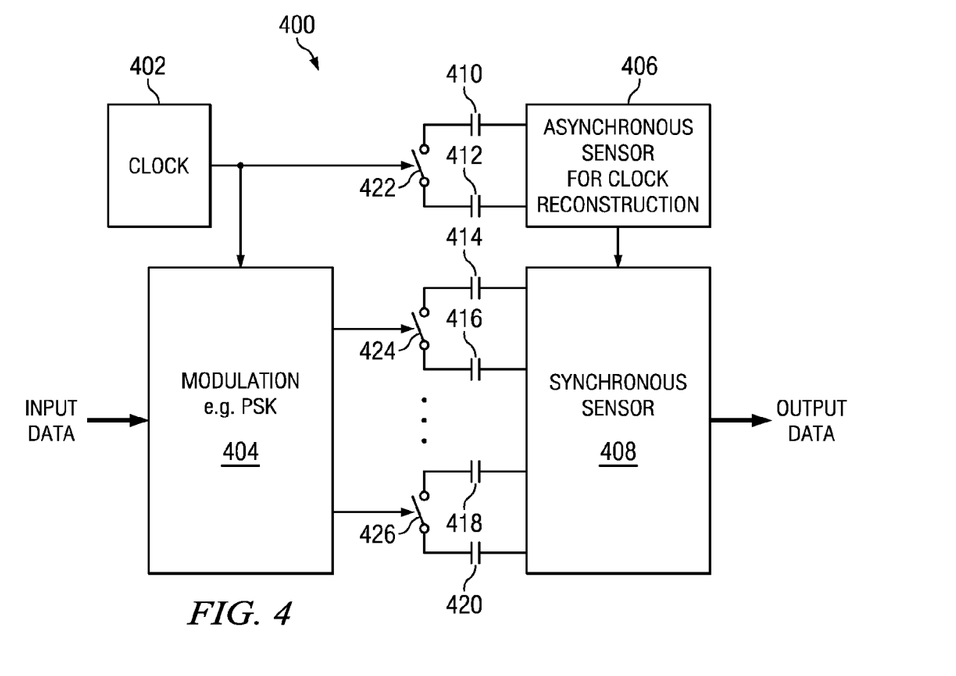
FIG. 4 illustrates a block diagram of an embodiment synchronous isolation barrier communication system.

FIG. 4 illustrates embodiment capacitive communication system 400 suitable for parallel transmission of several data bits including a validation mechanism by a shift clock signal using synchronous data transfer. Synchronous data transfer is advantageous in embodiments where the transmitter and the receiver do not provide stable clock frequencies, e.g. due to temperature drift. On the transmission side, system 400 has modulator 404, which is clocked by clock generator 402. Modulator 404 sends a plurality of data streams via switches 424 and 426 coupled to synchronous sensor 408 via an isolation barrier represented by capacitances 414, 416, 418 and 420. In alternative embodiments, one channel or three or more data channels can be transmitted. Furthermore, shift clock 402 operates switch 422 coupled to asynchronous clock sensor 406 via the isolation barrier represented by capacitances 410 and 412.

Asynchronous shift clock sensor 406 monitors the state of switch 422 by measuring the impedance of the isolation barrier represented by capacitors 410 and 412. Asynchronous clock sensor 406 then reconstructs the transmitted shift clock and triggers synchronous sensor 408, to perform impedance measurements of the isolation barrier according to the recovered shift clock. Asynchronous clock sensor 406 and synchronous sensor 408 operate according to embodiment sensing elements described herein. For example, in one embodiment the modulator changes state with one edge of the shift clock signal and receiver evaluates the impedances with the other shift clock edge. As such, the data is transferred synchronously using the shift clock.

Figure 5:
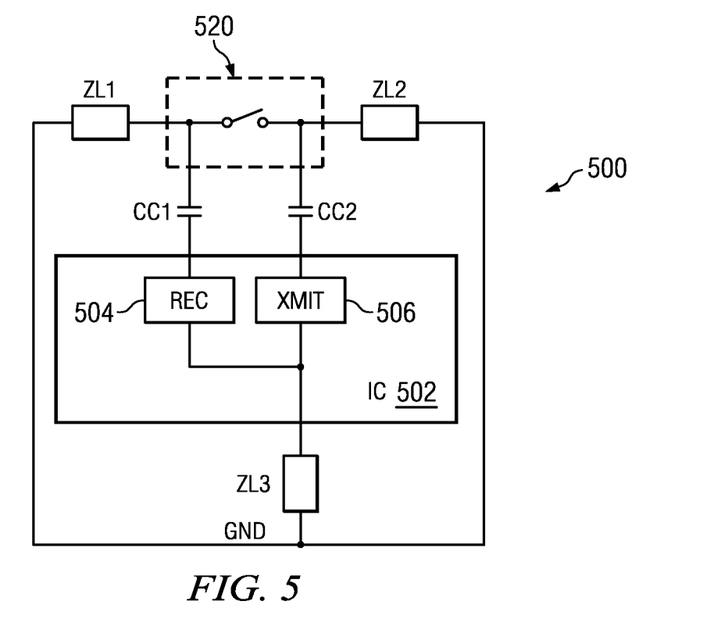
FIG. 5 illustrates an embodiment receiver circuit.
Figure 6:
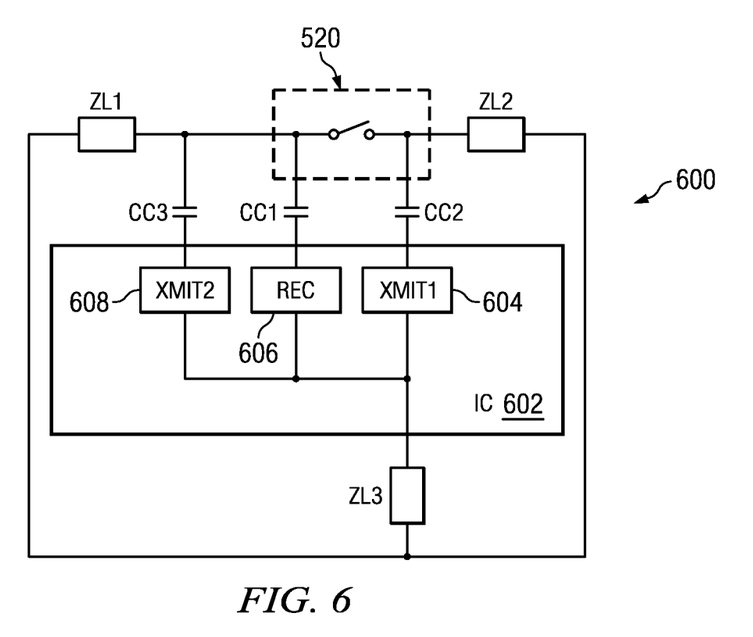
FIG. 6 illustrates another embodiment receiver circuit.

FIGS. 5 and 6 illustrate example embodiments of receiver circuits that detect the state of a passive transmitter. Further embodiment receivers and reception schemes are described in co-pending and commonly assigned U.S. patent application: Ser. No. 12/696,932, filed on Jan. 29, 2010, entitled, "System and Method for Testing a Circuit," which application is hereby incorporated herein by reference in its entirety.

FIG. 5 illustrates an embodiment communication system 500 showing passive transmitter switch 520 coupled to the sensing element of receiver IC 502 through an isolation barrier represented by capacitances CC1 and CC2. The sensing element of receiver IC 502 has receiver 504 coupled to a first side of passive transmitter switch 520 via capacitance CC1, and transmitter 506 coupled to a second side of passive transmitter switch 520 via capacitor CC2. Impedance ZL1 represents the impedance between a first side of passive transmitter switch 520 and GND of the passive transmitter, and impedance ZL2 represents a second side of passive transmitter switch 520 and GND of the passive transmitter. Impedance ZL3 represents the ground impedances from receiver IC 502 to GND of the passive transmitter.

During operation, in an embodiment, transmitter 506 of the sensing element transmits an AC signal, which is received by receiver 504 of the sensing element, as base for determining a transmission factor between transmitter 506 and receiver 504. The transmission factor comprises information about the attenuation (magnitude) and phase and represents an image of the impedance between transmitter 506 and the receiver 504. If the measured transmission factor (or parts of it) at the receiver is above a threshold, passive transmission switch 520 is determined to be open. If the measured transmission factor (or parts of it) is not above the threshold, passive transmission switch 520 is determined to be closed. In one embodiment, transmitter 506 transmits a current and receiver 504 receives a voltage. Alternatively, transmitter 506 can transmit either a voltage or current and receiver can receiver either a voltage or current. Therefore, in embodiments, the transmission from transmitter 506 to receiver 504 can be a voltage gain, current gain, tranconductance or transresistance. In further embodiments, signal gains using mixed currents and voltages can be measured.

According to FIG. 5, there are three return paths for a current generated at transmitter 506:
1. CC2→Switch 620→CC1→Receiver 604;
2. CC2→Switch 620→ZL1→ZL3; and
3. CC2→ZL2→ZL3

When switch 520 is closed and the impedance of path 1 is low compared to path 2 and path 3 in parallel, it can be assumed that a detectable input signal can be measured at receiver 504. This condition is fulfilled if an AC signal is chosen appropriately, mainly by adapting the frequency and the slew rate of the transmitted signal to avoid unintended resonance effects with ZLx. Further, the impedance of paths 2 and 3 can be adjusted by the introduction of the impedance ZL3, if necessary. When switch 520 is open, current along path 1 is due to parasitic coupling (e.g capacitive) between the disconnected parts of passive transmitter switch 520, whereas paths 2 and 3 always exist. In embodiments, the impedance in the parasitic return path when the switch is open is different from the impedance in path 1 when the switch is closed, resulting in different transmission factors. Differences in measured transmission factors can be directly related to the state of the switch and is usable for monitoring of the switch. In one embodiment, switch states are determined by comparing the measurement to a threshold. For example, if the measured transmission factor (or parts of it) through path 1 is above a threshold, passive transmitter switch 520 is determined to be closed. If, on the other hand the transmission factor (or parts of it) through path 1 is below the threshold, switch 520 is determined to be open.

FIG. 6 illustrates embodiment measurement system 600. The sensing element of receiver IC 602 has receiver 606 coupled to a first side of switch 520 via capacitance CC1, transmitter 608 of the sensing element coupled to the first side of passive transmitter switch 520 via capacitance CC3, and transmitter 604 of the sensing element coupled to a second side of passive transmitter switch 520 via capacitance CC2. Impedance ZL1 represents the impedance between a first side of passive transmitter switch 520 and GND, and impedance ZL2 represents the impedance between a second side of passive transmission switch 520 and GND. Impedance ZL3 represents the ground impedance from IC 602 to GND, respectively.

During operation of receiver IC 602, a first transmission factor (or parts of it) between transmitter 604 and receiver 606 of the sensing element is measured, then a second AC transmission factor (or parts of it) between transmitter 608 and receiver 606 of the sensing element is measured. If the ratio of the first transmission factor (or parts of it) to the second transmission factor (or parts of it) is greater than a threshold, then passive transmission switch 520 is considered to be closed. If, on the other hand, the ratio of the first transmission factor (or parts of it) to the second transmission factor (or parts of it) is not greater than the threshold, then passive transmission switch 520 is considered to be open. In an alternative embodiment of the present invention, receiver 606 is replaced by a single transmitter and transmitters 604 and 608 are replaced by two receivers. The first and second AC transmission factor (or parts of it) can, therefore, be simultaneously measured.

Figure 7:
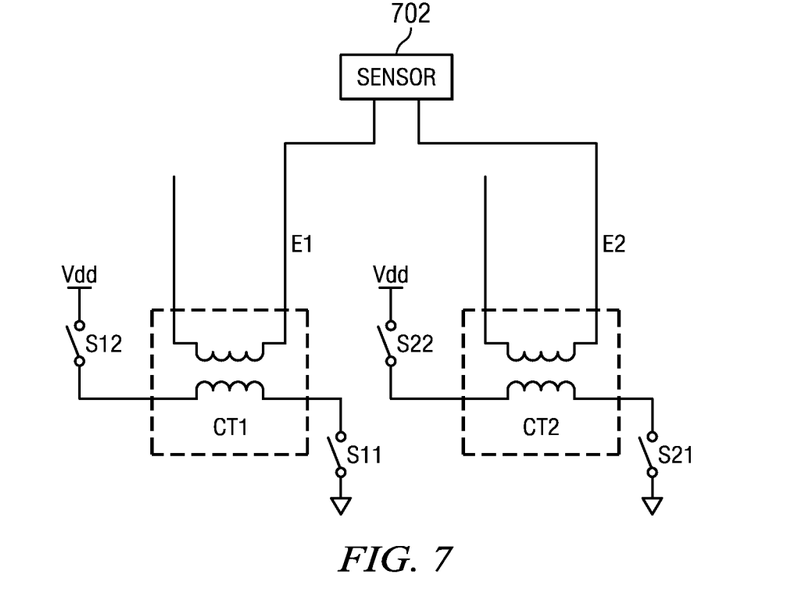
FIG. 7 illustrates an embodiment system using two coreless transformer (CT) coils.

In a further embodiment, electrode pairs can be implemented using coreless transformers (CT) as illustrated in the embodiment of FIG. 7. One terminal of the primary winding of coreless transformer CT1 is coupled to ground via switch S11, and the other terminal of the primary winding of CT1 is coupled to Vdd via switch S12. In addition, one terminal of the primary winding of coreless transformer CT2 is coupled to ground via switch S21, and the other terminal of the primary winding of CT2 is coupled to Vdd via switch S22. Secondary terminals E1 and E2 from CT1 and CT2, respectively, are coupled to sensor 702. Sensor 702 operates according to embodiment sensors described herein. In an embodiment, electrodes E1 and E2 are floating if all switches S11, S12, S21 and S22 are open. If either S11 and S21 or S12 and S22 are closed, however, electrodes E1 and E2 are coupled together.

Because pulses transmitted over the CT are very short, for example, less than 20 ns in one embodiment, CT coils are without current most of the time. Alternatively, other activation times besides 20 ns can be used. In embodiments where the transmitter has power saving mode, data transfer via the inductive coupling of the CT is disabled during the power savings mode.

In one embodiment using a CT coil, the CT coil is used to transmit pulses of one polarity. A first connection of a coil is coupled to a first terminal of the CT transmitter via a first switch and the second connection of a coil is directly connected to a second terminal of the CT transmitter. In some embodiments, a second switch is introduced between the second connection of the coil and the second terminal of the transmitter. The coil, therefore, can be separated from the transmitter by opening both switches. If only one of the switches is closed, one side of the coil is connected to one terminal of the transmitter. In some embodiments, two independent coils are connected to the transmitter via a similar structure. The modulation of the impedance between both coils is achieved by opening all 4 switches to indicate a first state and by connecting one side of each coil to the same transmitter terminal in a second state. In such an embodiment, each coil can be used as an electrode for capacitive coupling.

Figure 8:
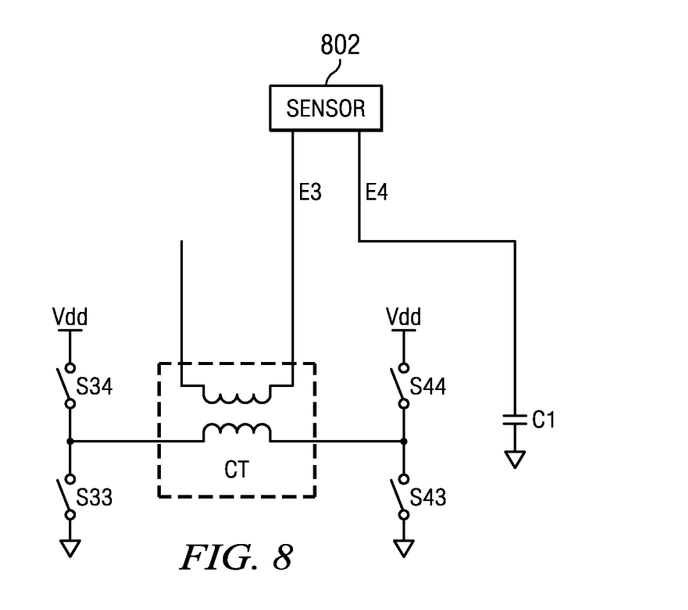
FIG. 8 illustrates an embodiment system using a CT coil in an H-bridge configuration.

FIG. 8 illustrates an embodiment in which the CT coil is coupled in an H-bridge structure. One terminal of CT coil CT is coupled to Vdd via switch S34 and to ground via switch S33. A second terminal of CT coil CT is coupled to Vdd via switch S44 and to ground via switch S43. Sensor 802, which operates according to sensor embodiments described herein, is coupled to secondary terminal E3 and to ground via capacitance C1 at terminal E4. Here, data pulses with both polarities are transferred via the CT. In an embodiment, electrode E3 is floating if all switches S33, S34, S43 and S44 are open due to bad coupling between of electrodes E3 to E4. Electrodes E3 and E4 are coupled if S33 or S43 are closed. The modulation scheme of the impedance works in a similar way, with the coil being one electrode, and one terminal of the transmitter being the second electrode.

Advantages of embodiments of the present invention include very low power consumption on passive transmitter side and the ability to deliver a permanently valid data signal, or slowly changing signals without refresh pulses. Furthermore, in some embodiments, low capacitance sensing electrodes can be used (e.g., below 1 pF for integrated capacitors on an IC) or a relatively high distance between the transmitter and the receiver tolerated, for example, up to the centimeter range to support high isolation capability. Alternatively, the supported ranges can be higher or lower depending on the embodiment at its specifications. The shape of sensing electrodes can be adapted to application requirements, and different types of isolation barriers can be supported, for example on-chip, on PCB, within a package, etc.

Advantages of embodiments further include the ability to place analog or digital circuit elements under the sensing electrode, for example, in the case of using a metal layer of a chip for a sensing electrode.

Another advantage of embodiments that include a passive transmitter and an active receiver includes the ability to minimize power consumption on the transmitter side and expend power on the receiver side where the power budget is less restricted. This is also advantageous in applications, such as those using power saving modes, which has a minimal the power budget on the transmitter side.

A further advantage of the capacitive communication channel from a safety point of view is the fact that it is insensitive to "stuck at errors," hence only AC signals can pass the capacitive coupling path. Embodiments of the present invention also offer the flexibility to use different modulator and demodulator implementations that are known for digital RF transmission. However, with respect to embodiment implementations that are capacitively coupled, the received signals will have high SNR compared to RF conditions. Therefore, modulators and demodulators of lower complexity can be used when appropriate.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacture, compositions of matter, means, methods, or steps.

What is claimed is:

1. A circuit for receiving data from a passive transmitter through an isolation barrier, the circuit comprising:
   an impedance measurement circuit comprising a plurality of terminals coupled to the isolation barrier, the impedance measurement circuit configured to measure an impedance between the plurality of terminals, and configured to determine a state of the passive transmitter based on the measured impedance.

2. The circuit of claim 1, wherein the impedance measurement circuit is further configured to:
   measure a first impedance between a first terminal and a second terminal;
   measure a second impedance between the second terminal and a third terminal;
   determine that the passive transmitter is in a first transmission state when the first measured impedance is greater than the second measured impedance; and
   determine that the passive transmitter is in a second transmission state when the first measured impedance is not greater than the second measured impedance.

3. The circuit of claim 1, wherein the impedance measurement circuit is configured to measure the impedance by:
   determining a first transmission factor between a first terminal and a second terminal;
   determining a second transmission factor between the first terminal and a third terminal;
   determining that the passive transmitter is in a first state if a ratio of the first transmission factor to the second transmission factor is greater than a threshold; and
   determining that the passive transmitter is in a second state if the ratio of the first transmission factor to the second transmission factor is not greater than the threshold.

4. The circuit of claim 1, further comprising the isolation barrier.

5. The circuit of claim 4, wherein the isolation barrier comprises a capacitive isolation barrier.

6. The circuit of claim 4, wherein the isolation barrier comprises a magnetic transformer.

7. A system for communicating data across an isolation barrier, the system comprising:
   a data transmitter coupled to a first portion of the isolation barrier, the transmitter configured to modulate an impedance coupled to the first portion of the isolation barrier, wherein the impedance is modulated according to the data; and
   a receiver coupled to a second portion of the isolation barrier opposite the first portion of the isolation barrier, wherein the receiver is configured to receive the data by measuring an impedance of a second portion of the isolation barrier opposite the first portion of the isolation barrier.

8. The system of claim 7, wherein:
   the data transmitter comprises a first switch coupled to the first portion of the isolation barrier; and
   the data transmitter is configured to modulate the impedance by opening and closing the first switch.

9. The system of claim 7, further comprising:
   a clock transmitter coupled to a third portion of the isolation barrier, the clock transmitter configured to transmit a clock by modulating a second impedance coupled to a third portion of the isolation barrier, wherein the data transmitted by the data transmitter transitions according to the clock.

10. The system of claim 9, further comprising a clock receiver coupled to a fourth portion of the isolation barrier opposite the third portion of the isolation barrier, wherein the clock receiver is configured to receive the clock by measuring an impedance of a fourth portion of the isolation barrier.

11. The system of claim 7, wherein the isolation barrier comprises a printed circuit board (PCB) coupled between the data transmitter and the receiver.

12. The system of claim 7, wherein:
   the data transmitter is disposed in a first isolated domain of an integrated circuit;
   the receiver is disposed in a second isolated domain of the integrated circuit; and the isolation barrier comprises a capacitor coupled between the data transmitter and the receiver.

13. The system of claim 12, wherein the data transmitter and the receiver are separated by a deep trench.

14. The system of claim 13, wherein the capacitor is disposed on the integrated circuit over the deep trench.

15. A system for synchronously transferring data from one side of an isolation barrier to another other side of the isolation barrier, the system comprising:
    a clock transmitter coupled to a first side of the isolation barrier, the clock transmitter configured to transmit a shift clock signal through a first signal path of the isolation barrier; and
    a data transmitter coupled to the first side of the isolation barrier, the data transmitter configured to transmit a data signal though a second signal path of the isolation barrier, wherein the data transmitter is configured to change an impedance between at least two terminals of the second signal path according to data to be transmitted at one edge of the shift clock signal.

16. The system of claim 15, further comprising
    a clock receiver coupled to a second side of the isolation barrier, the clock receiver configured to receive the shift clock signal from the first signal path of the isolation barrier and to provide a trigger signal at a second edge of the received shift clock signal.

17. The system of claim 16, further comprising a data receiver coupled to the second side of the isolation barrier, wherein the data receiver is configured to evaluate an impedance of the second signal path of the isolation barrier when activated by the trigger signal.

18. The system of claim 15, further comprising a data modulator coupled to the data transmitter, the data modulator configured to provide a plurality of modulated data signals based on the data.

19. The system of claim 18, wherein:
    the second signal path comprises a plurality of second signal paths; and
    the data transmitter is configured to change a plurality of impedances between terminals the plurality of second signal paths according to the modulated data signals.

20. The system of claim 15, wherein:
    the data transmitter comprises a switch coupled the first side of the isolation barrier; and
    the data transmitter is configured to change the impedance by opening and closing the switch.

21. A method of receiving data from a capacitively coupled passive transmitter, the method comprising:
    measuring a first impedance between a first terminal coupled to a first side of the passive transmitter and second terminal coupled to a first side of a passive transmitter;
    measuring a second impedance between the first terminal coupled to the first side of the passive transmitter and a third terminal coupled to a second side of the passive transmitter;
    sending a first data state to a receiver when a ratio of the first impedance to the second impedance is greater than a threshold; and
    sending a second data state to the receiver when the ratio of the first impedance to the second impedance is not greater than the threshold.

* * * * *